United States Patent
Peterson et al.

(10) Patent No.: US 10,352,975 B1
(45) Date of Patent: Jul. 16, 2019

(54) SYSTEM LEVEL FILTERING AND CONFIDENCE CALCULATION

(71) Applicant: PARADE TECHNOLOGIES, LTD., Santa Clara, CA (US)

(72) Inventors: Jonathan R Peterson, Everett, WA (US); Cole D Wilson, Everett, WA (US); David G Wright, San Diego, CA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 1248 days.

(21) Appl. No.: 13/727,944

(22) Filed: Dec. 27, 2012

Related U.S. Application Data

(60) Provisional application No. 61/726,595, filed on Nov. 15, 2012.

(51) Int. Cl.
| | | |
|---|---|---|
| *G01R 25/00* | (2006.01) | |
| *G01R 27/00* | (2006.01) | |
| *G01R 27/26* | (2006.01) | |
| *G06F 17/00* | (2019.01) | |

(52) U.S. Cl.
CPC ......... *G01R 27/2605* (2013.01); *G06F 17/00* (2013.01)

(58) Field of Classification Search
CPC . G01R 27/2605; G06F 3/0416; G06F 3/0488; G01B 21/04
USPC .......................................................... 702/65
See application file for complete search history.

(56) References Cited

U.S. PATENT DOCUMENTS

| | | | |
|---|---|---|---|
| 5,530,907 A | 6/1996 | Pavey et al. | |
| 6,323,846 B1 | 11/2001 | Westerman et al. | |
| 6,741,928 B2 | 5/2004 | Millington et al. | |
| 7,633,501 B2 | 12/2009 | Wood et al. | |
| 7,821,503 B2 | 10/2010 | Stephanick et al. | |
| 7,885,436 B2 | 2/2011 | Russo et al. | |
| 8,018,440 B2 | 9/2011 | Townsend et al. | |
| 8,180,641 B2 | 5/2012 | Levit et al. | |
| 8,199,126 B1 * | 6/2012 | Taubman | G06F 3/011 345/156 |
| 8,674,943 B2 * | 3/2014 | Westerman | G06F 3/0235 345/173 |
| 2003/0186663 A1 * | 10/2003 | Chen | G06K 9/3241 455/226.3 |
| 2003/0189603 A1 | 10/2003 | Goyal et al. | |

(Continued)

OTHER PUBLICATIONS

Mengusoglu, Erhan, "Condence Measures for Speech/Speaker Recognition and Applications on Turkish LVCSR," Doctoral Thesis accepted by the Faculte Polytechnique de Mons, Apr. 20, 2014; 143 pages.

(Continued)

*Primary Examiner* — Michael P Nghiem
(74) *Attorney, Agent, or Firm* — Morgan, Lewis & Bockius LLP

(57) ABSTRACT

A contact's interaction with a sensing array is subject to several external and internal stimuli which may impact a processing unit's confidence in the characteristics of that interaction or the presence of the interaction itself. Fidelity of user action is greatly improved with a step-wise and holistic analysis of a contact on an array of capacitance sensors, which allows for repetition of certain steps of processing or the entire operation if threshold confidence levels are not achieved.

24 Claims, 13 Drawing Sheets

(56) References Cited

U.S. PATENT DOCUMENTS

| | | | |
|---|---|---|---|
| 2007/0152976 A1* | 7/2007 | Townsend | G06F 3/0416 345/173 |
| 2007/0197889 A1* | 8/2007 | Brister | A61B 5/1411 600/347 |
| 2009/0174676 A1* | 7/2009 | Westerman | G06F 3/0418 345/173 |
| 2010/0023319 A1 | 1/2010 | Bikel et al. | |
| 2012/0218229 A1* | 8/2012 | Drumm | G06F 3/0421 345/175 |
| 2012/0249476 A1* | 10/2012 | Schwartz | G06F 3/044 345/174 |
| 2013/0300696 A1* | 11/2013 | Haran | G06F 3/041 345/173 |
| 2014/0022201 A1* | 1/2014 | Boychuk | G06F 3/041 345/174 |
| 2014/0022206 A1* | 1/2014 | van de Waerdt | G06F 3/0416 345/174 |
| 2014/0062886 A1* | 3/2014 | Pasquero | G06F 3/0237 345/168 |

OTHER PUBLICATIONS

Metze, F., "Confidence Measure Based Language Identification," 2000 IEEE International Conference on Acoustics, Speech, and Signal Processing, 2000 (vol. 3), Jun. 5, 2000-Jun. 9, 2000, pp. 1827-1830.

Weintraub, Mitch, "Neural—Network Based Measures of Confidencefor Word Recognition," IEEE International Conference on Acoustics, Speech, and Signal Processing (vol. 2 ), Apr. 21-24, 1997, pp. 887-890.

Wu, Chaohong, "Advanced Feature Extraction Algorithms for Automatic Fingerprint Recognition Systems," Doctoral Dissertation submitted to Faculty of the Graduate School of State University of New York at Buffalo, Apr. 2007; 146 pages.

* cited by examiner

FIGURE 5A

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | 7 |   |   |   |   |
| 4 |   |   | 10 | 100 | 20 |   |   |   |
| 5 |   |   |   | 18 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

FIGURE 5B

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | 1 |   |   |   |   |
| 4 |   |   | 1 | 2 | 1 |   |   |   |
| 5 |   |   |   | 1 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

FIGURE 5C

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | 7 |   |   |   |   |
| 4 |   |   | 10 | 50 | 20 |   |   |   |
| 5 |   |   |   | 18 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

FIGURE 5D

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | .28 |   |   |   |   |
| 4 |   |   | .4 | 1.0 | .8 |   |   |   |
| 5 |   |   |   | .6 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

FIGURE 6A

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | 7 |   |   |   |   |
| 4 |   |   | 10 | 100 | 20 |   |   |   |
| 5 |   |   |   | 18 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

FIGURE 6B

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | 4 |   |   |   |   |
| 4 |   |   | 8 | 10 | 8 |   |   |   |
| 5 |   |   |   | 4 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

FIGURE 6C

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | 1.8 |   |   |   |   |
| 4 |   |   | 1.3 | 10 | 2.5 |   |   |   |
| 5 |   |   |   | 3.5 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

FIGURE 6D

|   | A | B | C | D | E | F | G | H |
|---|---|---|---|---|---|---|---|---|
| 1 |   |   |   |   |   |   |   |   |
| 2 |   |   |   |   |   |   |   |   |
| 3 |   |   |   | .07 |   |   |   |   |
| 4 |   |   | .05 | .4 | .1 |   |   |   |
| 5 |   |   |   | .14 |   |   |   |   |
| 6 |   |   |   |   |   |   |   |   |
| 7 |   |   |   |   |   |   |   |   |
| 8 |   |   |   |   |   |   |   |   |
| 9 |   |   |   |   |   |   |   |   |
| 10 |   |   |   |   |   |   |   |   |

SYSTEM LEVEL FILTERING AND
CONFIDENCE CALCULATION

RELATED APPLICATIONS

This application claims the benefit of U.S. Provisional Application No. 61/726,595, filed on Nov. 15, 2012, which is incorporated by reference herein.

TECHNICAL FIELD

This disclosure relates to the field of touch-sensors and, in particular, to capacitance touchscreens.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor elements that detect the position of one or more conductive objects, such as a finger or a stylus pen. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

FIG. 5A-D illustrate an example of measured capacitance values, noise, an associated confidence levels for a low-noise environment.

FIG. 6A-D illustrate an example of measured capacitance values, noise, an associated confidence levels for a high-noise environment.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

An embodiment of a capacitive sensor array may include sensor elements arranged such that each unit cell corresponding to an intersection between sensor elements may include a main trace and one or more primary subtraces branching away from the main trace. In one embodiment, a sensor element may also include one or more secondary subtraces branching from a primary subtrace, or one or more tertiary subtraces branching from a secondary subtrace. In one embodiment, a sensor array having such a pattern may have decreased signal disparity and reduced manufacturability problems as compared to other patterns, such as a diamond pattern. Specifically, a capacitive sensor array with sensor elements having main traces and subtraces branching from the main trace, such as a totem pole pattern, may be manufactured with decreased cost and increased yield rate, as well as improved optical quality.

An embodiment of such a capacitive sensor array may include a first and a second plurality of sensor elements each intersecting each of the first plurality of sensor elements. Each intersection between one of the first plurality of sensor elements and one of the second plurality of sensor elements may be associated with a corresponding unit cell. A unit cell may be a single node or pixel of capacitance measurement on the capacitive sensor array. In one embodiment, a unit cell corresponding to an intersection may be understood as an area including all locations on the surface of the sensor array that are nearer to the corresponding intersection than to any other intersection between sensor elements.

In one embodiment of a capacitive sensor array, each of the second plurality of sensor elements includes a main trace that crosses at least one of the plurality of unit cells, and further includes, within each unit cell, a primary subtrace that branches away from the main trace. In one embodiment, the primary subtrace may be one of two or more primary subtraces branching symmetrically from opposite sides of the main trace, resembling a "totem pole". Alternatively, the primary subtraces may branch asymmetrically from the main trace.

Figure 1:
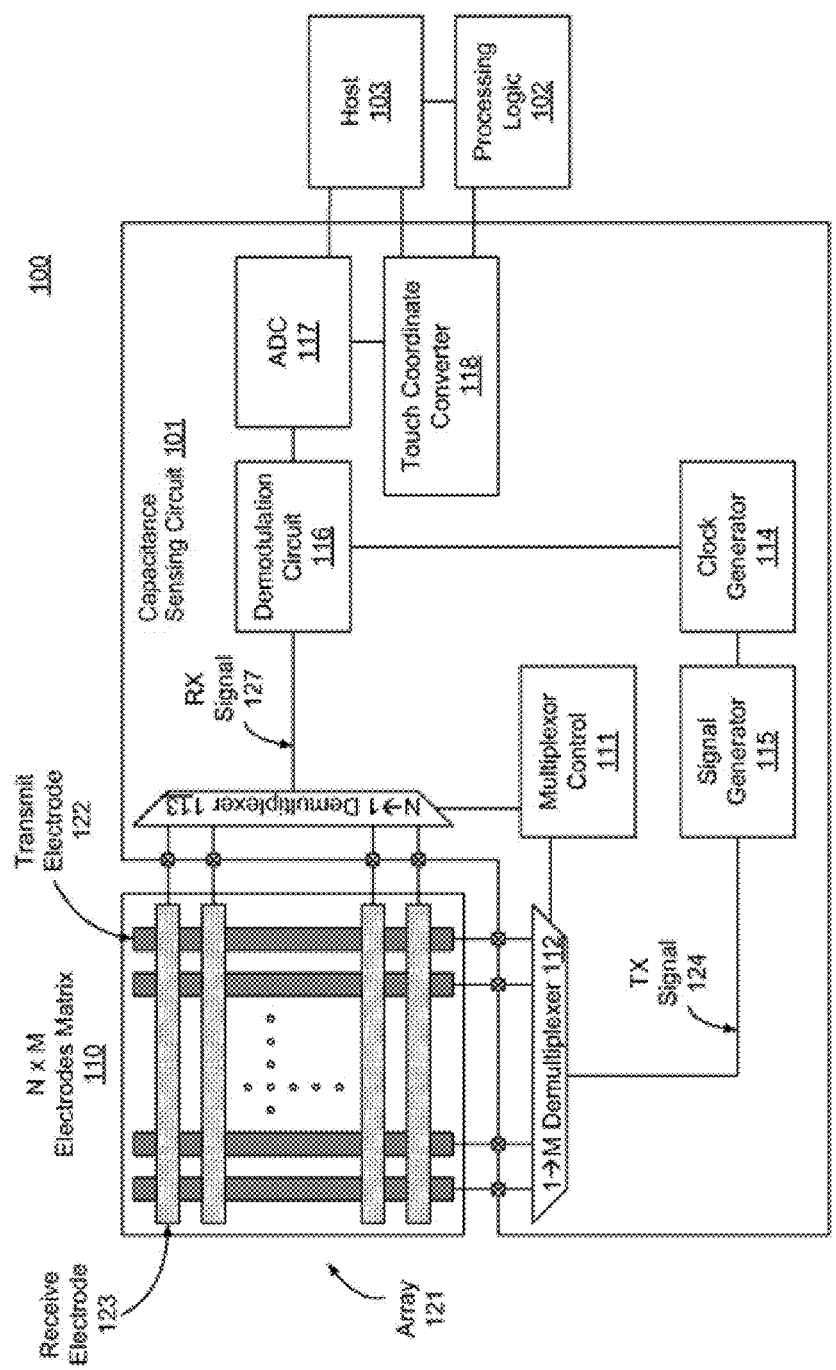
FIG. 1 is a block diagram illustrating an embodiment of an electronic system that processes touch sensor data.

FIG. 1 is a block diagram illustrating one embodiment of a capacitive touch sensor array 121 and a capacitance sensing circuit 101 that converts measured capacitances to coordinates. The coordinates are calculated based on measured capacitances. In one embodiment, touch sensor array 121 and capacitance sensing circuit 101 are implemented in a system such as electronic system 100. Electronic system 100 may be a touchscreen or touchpad, which may part of a mobile phone, a tablet PC, a laptop PC or other computing device. The electronic system may also be a front panel display with an array of buttons with sensing electrodes tied to each one specifically or in a matrix. Touch sensor array 121 includes a matrix 110 of N×M electrodes (N receive electrodes and M transmit electrodes), which further includes transmit (TX) electrode 122 and receive (RX) electrode 123. Each of the electrodes in matrix 110 may be connected with capacitance sensing circuit 101 through demultiplexer 112 and multiplexer 113.

Capacitance sensing circuit 101 may include multiplexer control 111, demultiplexer 112 and multiplexer 113, clock generator 114, signal generator 115, demodulation circuit 116, and analog-to-digital converter (ADC) 117. ADC 117 is further coupled with touch coordinate converter 118. Touch coordinate converter 118 outputs a signal to the processing logic 102. Processing logic may output to host 103 in one embodiment. In another embodiment, host 103 may receive data directly from ADC 117 or touch coordinate converter 118.

The transmit and receive electrodes in the matrix 110 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 122 is capacitively coupled with receive electrode 123 at the point where transmit electrode 122 and receive electrode 123 overlap.

Clock generator 114 supplies a clock signal to signal generator 115, which produces a TX signal 124 to be supplied to the transmit electrodes of touch sensor array 121. In one embodiment, the signal generator 115 includes a set of switches that operate according to the clock signal from clock generator 114. The switches may generate a TX signal 124 by periodically connecting the output of signal generator 115 to a first voltage and then to a second voltage, wherein said first and second voltages are different.

The output of signal generator 115 is connected with demultiplexer 112, which allows the TX signal 124 to be applied to any of the M transmit electrodes of touch sensor array 121. In one embodiment, multiplexer control 111 controls demultiplexer 112 so that the TX signal 124 is applied to each transmit electrode 122 in a controlled sequence. Demultiplexer 112 may also be used to ground, float, or connect an alternate signal to the other transmit electrodes to which the TX signal 124 is not currently being applied.

Because of the capacitive coupling between the transmit and receive electrodes, the TX signal 124 applied to each transmit electrode induces a current within each of the receive electrodes. For instance, when the TX signal 124 is applied to transmit electrode 122 through demultiplexer 112, the TX signal 124 induces an RX signal 127 on the receive electrodes in matrix 110. The RX signal 127 on each of the receive electrodes can then be measured in sequence by using multiplexer 113 to connect each of the N receive electrodes to demodulation circuit 116 in sequence. In one embodiment, multiple multiplexers may allow RX signals to be received in parallel by multiple demodulation circuits.

The mutual capacitance associated with each intersection between a TX electrode and an RX electrode can be sensed by selecting every available combination of TX electrode and an RX electrode using demultiplexer 112 and multiplexer 113. To improve performance, multiplexer 113 may also be segmented to allow more than one of the receive electrodes in matrix 110 to be routed to additional demodulation circuits 116. In an optimized configuration, wherein there is a 1-to-1 correspondence of instances of demodulation circuit 116 with receive electrodes, multiplexer 113 may not be present in the system.

When an object, such as a finger or stylus, approaches the matrix 110, the object causes a decrease in the mutual capacitance between only some of the electrodes. For example, if a finger or stylus is placed near the intersection of transmit electrode 122 and receive electrode 123, the presence of the finger will decrease the mutual capacitance between electrodes 122 and 123. Thus, the location of the finger on the touchpad can be determined by identifying the one or more receive electrodes having a decreased mutual capacitance in addition to identifying the transmit electrode to which the TX signal 124 was applied at the time the decreased mutual capacitance was measured on the one or more receive electrodes.

By determining the mutual capacitances associated with each intersection of electrodes in the matrix 110, the locations of one or more touch contacts may be determined. The determination may be sequential, in parallel, or may occur more frequently at commonly used electrodes.

In alternative embodiments, other methods for detecting the presence of a finger or conductive object may be used where the finger or conductive object causes an increase in capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined from the locations of one or more electrodes at which an increased capacitance is detected.

The induced current signal (RX signal 127) is rectified by demodulation circuit 116. The rectified current output by demodulation circuit 116 can then be filtered and converted to a digital code by ADC 117.

The digital code is converted to touch coordinates indicating a position of an input on touch sensor array 121 by touch coordinate converter 118. The touch coordinates are transmitted as an input signal to the processing logic 102. In one embodiment, the input signal is received at an input to the processing logic 102. In one embodiment, the input may be configured to receive capacitance measurements indicating a plurality of row coordinates and a plurality of column coordinates. Alternatively, the input may be configured to receive row coordinates and column coordinates.

In one embodiment, touch sensor array 121 can be configured to detect multiple touches. One technique for multi-touch detection uses a two-axis implementation: one axis to support rows and another axis to support columns. Additional axes, such as a diagonal axis, implemented on the surface using additional layers, can allow resolution of additional touches.

Figure 2A:
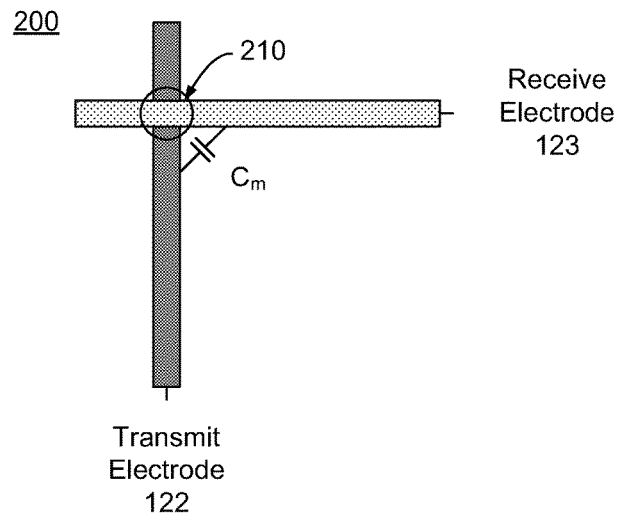
FIG. 2A illustrates an embodiment of a transmit and receive electrode in a mutual capacitance array.

FIG. 2A illustrates an embodiment of a simplified representation 200 of an embodiment of a single intersection, or node 210, of a transmit electrode 122 and a receive electrode 123. Transmit electrode 122 is coupled to 1→M demultiplexer 112 and receive electrode 123 is coupled to N→1 multiplexer 113 as shown in FIG. 1. Node 210 is characterized by mutual capacitance, Cm, between transmit electrode 122 and receive electrode 123. A mutual capacitance, Cm, exists for every intersection between every transmit electrode and every receive electrode in N×M electrode matrix 110 (shown in FIG. 1).

Figure 2B:
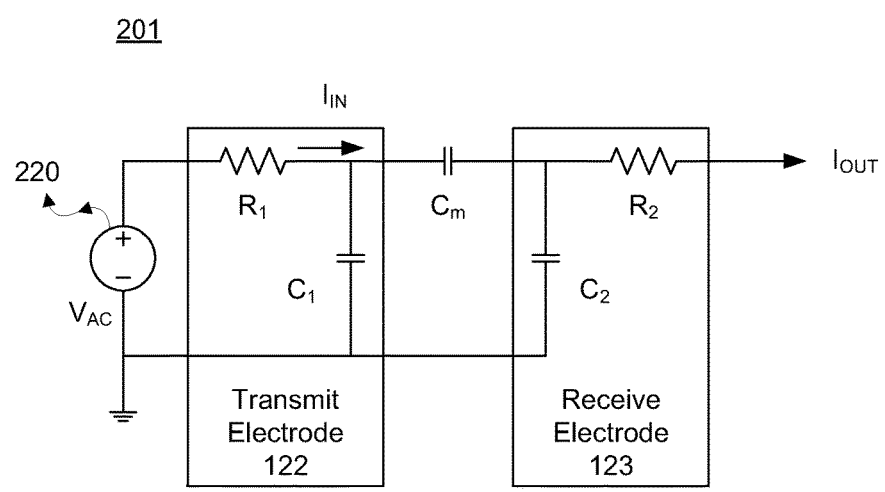
FIG. 2B illustrates a schematic representation of an embodiment of a transmit and receive electrode in a mutual capacitance array.

FIG. 2B illustrates a circuit representation 201 of a single intersection, or node 210, from FIG. 2A. Transmit electrode 122 comprises a resistance, $R_1$, and a parasitic capacitance, $C_1$. Receive electrode 123 comprises a resistance, $R_2$, and a parasitic capacitance, $C_2$. Resistances $R_1$ and $R_2$ are a function of the impedance of transmit electrode 122 and receive electrode 123, respectively. High impedance materials, such as indium tin oxide, limit the rate of charge and discharge on transmit and receive electrodes. Capacitors $C_1$ and $C_2$ represent the parasitic capacitance each electrode has to the rest of the array and the rest of the system for each transmit electrode 122 and each receive electrode 123, respectively. Parasitic capacitances $C_1$ and $C_2$ are the capacitance of each electrode to everything in the system except the transmit or receive electrode that comprises the other side of node 210. Voltage source 220 may provide an alternating voltage source (signal) on transmit electrode 122, thus generating a current, $I_{in}$, through resistor $R_1$, and building a voltage potential on mutual capacitor $C_m$. This voltage potential is then converted to a current, $I_{out}$, through resistor $R_2$. Current $I_{out}$ is representative of the mutual capacitance, $C_m$, between transmit electrode 122 and receive electrode 123.

Figure 3:
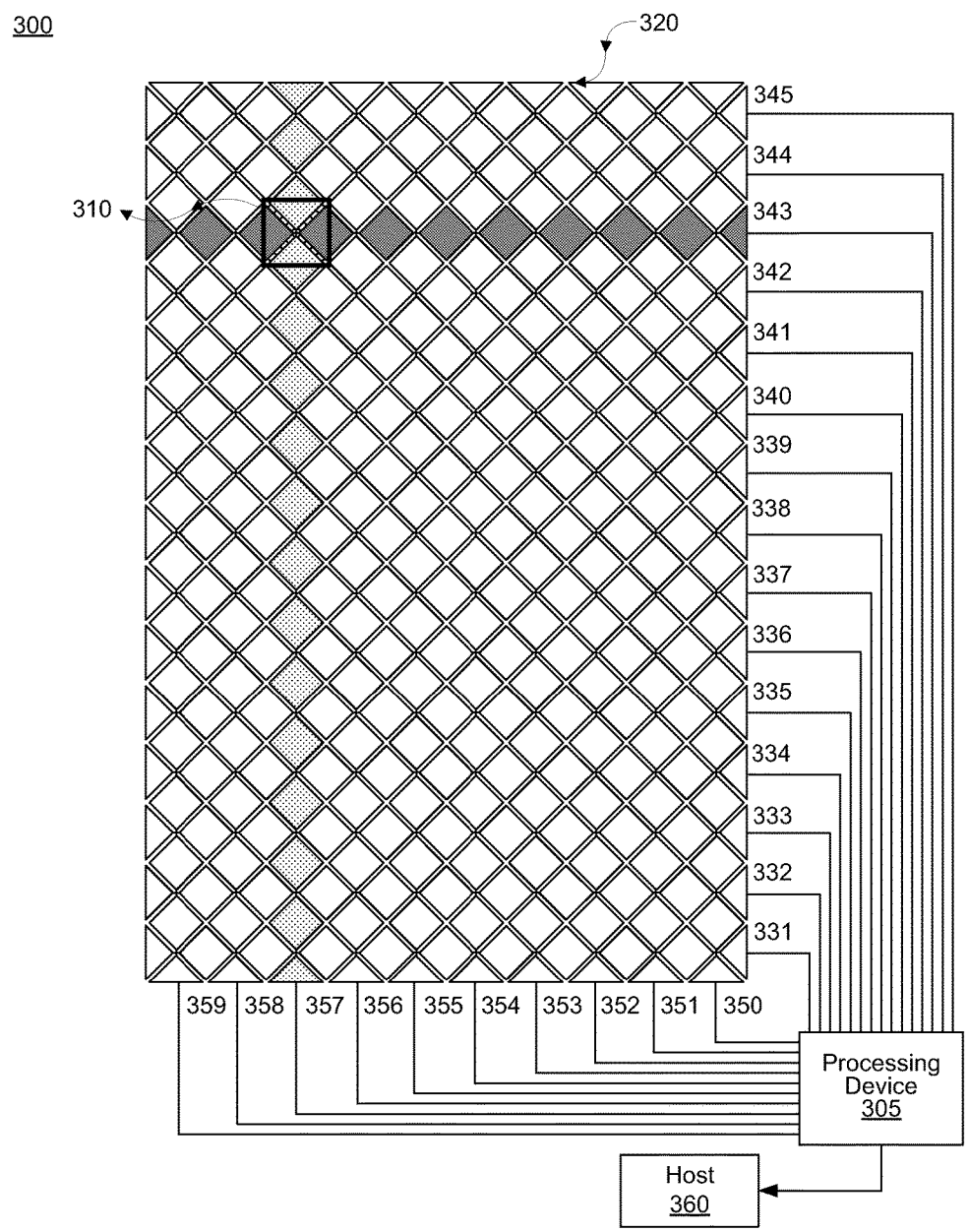
FIG. 3 illustrates an embodiment of a capacitive sensor array having a diamond pattern.

FIG. 3 illustrates an embodiment of a capacitive touch sensing system 300 that includes a capacitive sensor array 320. Capacitive sensor array 320 includes a plurality of row sensor elements 331-345 and a plurality of column sensor elements 350-359. The row and column sensor elements 331-445 and 350-359 are connected to a processing device 305, which may include the functionality of capacitance sensing circuit 101 of FIG. 1. In one embodiment, the processing device 305 may perform TX-RX scans of the capacitive sensor array 320 to measure a mutual capacitance value associated with each of the intersections, or nodes, 310, between a row sensor element and a column sensor element in the sensor array 320. The measured capacitances may be further processed to determine centroid, or center of mass, locations of one or more contacts at the capacitive sensor array 320.

In one embodiment, the processing device 305 is connected to a host 360 which may receive the measured capacitances or calculated centroid locations from the processing device 305.

The capacitive sensor array 320 illustrated in FIG. 3 may include sensor elements arranged in a diamond pattern. Specifically, the sensor elements 331-345 of capacitive sensor array 320 may be arranged in a single solid diamond (SSD) pattern as shown in FIG. 3. In other embodiments, the sensors elements 331-345 and 350-359 may be hollow diamonds ("single hollow diamonds") or may be pairs of diamonds coupled at one or both ends ("dual solid diamonds"). In another embodiment, pairs of hollow diamonds may be coupled at one or both ends ("dual hollow diamonds").

Figure 4A:
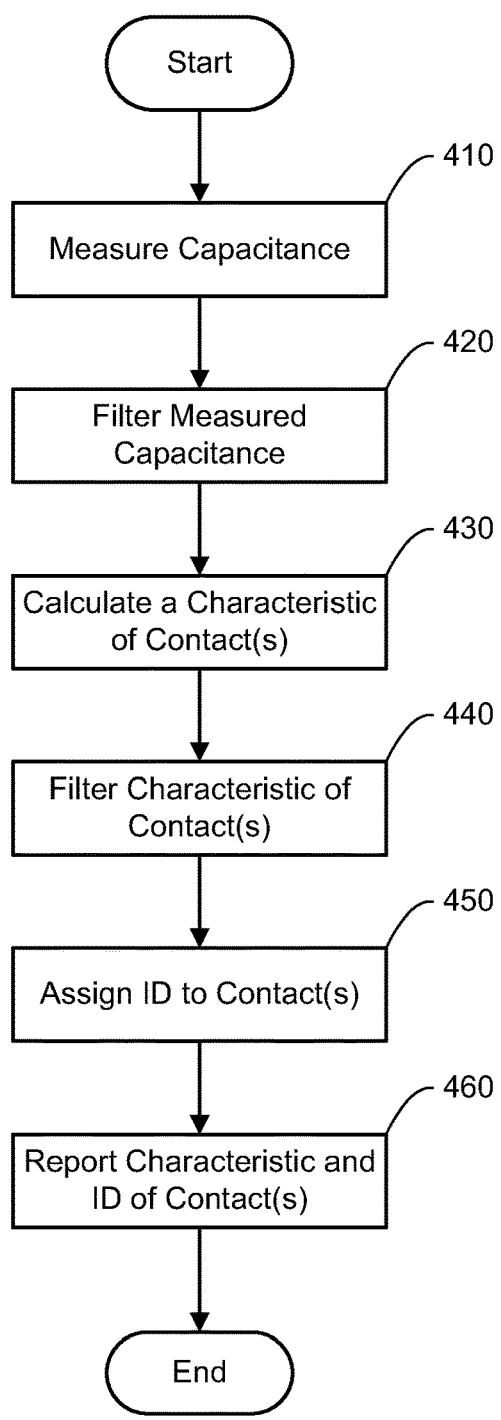
FIG. 4A illustrates one embodiment of a method for measuring capacitance and reporting position to a host.

FIG. 4A illustrates one embodiment 400 of a method for measuring capacitance and reporting information to a host as may be practiced by electronic system 100 (FIG. 1). Capacitance is measured by capacitance sensing circuit 101 in step 410 as described above. Capacitance may be measured by a mutual capacitance circuit similar to that illustrated in FIG. 1. Capacitance may also be measured by a self-capacitance circuit, wherein each electrode in array 121 is measured individually by a measurement circuit and the capacitance thereof is to each electrodes surroundings and not to a specific electrode or plurality of electrodes, as is in mutual capacitance. The measured capacitance from step 410 may then be filtered in step 420. In one embodiment, the measured capacitance may be filtered in hardware, such as with compensation capacitors, charging circuits, or other circuits configurable to adjust the output of the capacitance measurement circuit. In another embodiment, the measured capacitance may be filtered in software or firmware. Software or firmware filtering of measured capacitance data may be performed by processing logic 102 of FIG. 1. In this embodiment, ADC 117 may output to processing logic 102 and processing logic 102 may output filtered capacitance measurement data to touch coordinate converter 118. In either the hardware, firmware, or software filtering embodiments, filtered measured capacitance data from step 420 may be used in step 430 to calculate a characteristic of at least one contact on array 121 by touch coordinate converter 118 of FIG. 1. Touch coordinate converter may be part of a circuit or logic configured to detect the size of the contact on the array. In this embodiment, the number of sensors or signal strength detected on the sensors may be indicative of the size of the contact on the array. In another embodiment, the characteristic may be a shape fit to the measured capacitance on the array. The shape may be an ellipse having a long and short axis. The ellipse may also have an angle from vertical or horizontal indicative of the angle of the contact on the array. The characteristic of each of the at least one contact may then be filtered by processing logic 102 in step 440. And the filtered characteristic used to assign an identification to each of the at least one contact in step 450. Contact identification in step 450 may be completed by processing logic 102. Each contact of the at least one contact and its associated identification may then reported to a host or operating system in step 460. In another embodiment, more than one characteristic may be detected and reported to the host. For example, the position, size, ellipse shape (axes), and angle of the contact on the array may be calculated. The information passed to the host may include a confidence level for each characteristic. In this embodiment, the confidence levels may be calculated by ADC 117 for the capacitance-to-digital conversion, the touch coordinate converter 118 for the capacitance-to-digital conversion, the position characteristics, or presence. In one embodiment, processing logic 102 may calculate confidence levels for each characteristic, the capacitance-to-digital conversion, gestures, or other contact features. In another embodiment, the confidence level for each characteristic, the capacitance-to-digital conversion, gestures, or other contact features may be calculated by the host. In still another embodiment, an aggregate confidence level for all of the characteristics may be calculated and passed to the host.

Each step of method 400 may have a confidence associated with it. The confidence of each step may be a factor of the power supply, the processing time allocated to each step, the noise of the capacitance measurement circuit, or other internal or external stimuli. The easiest stimulus to measure or detect may be EMI in and around the system or power supply and its impact on the capacitance-to-digital conversion by ADC 117 of FIG. 1. However, each step of method 400 may have particular susceptibility to stimuli.

Figure 4B:
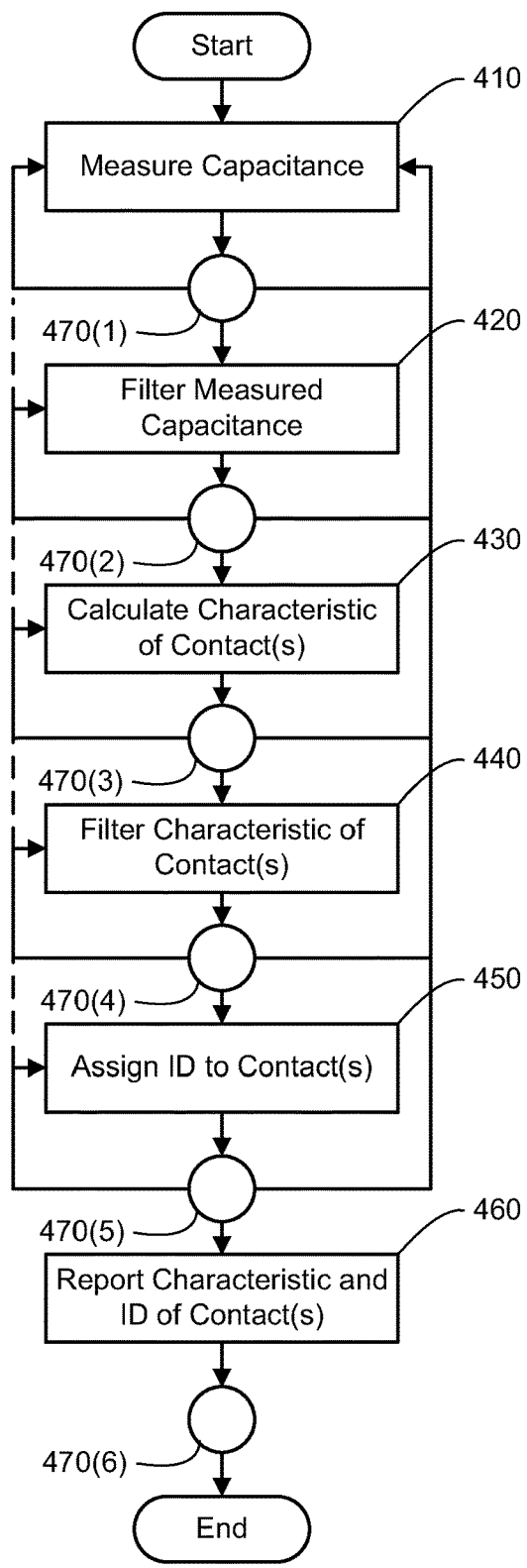
FIG. 4B illustrates one embodiment of a method for measuring capacitance and reporting position to a host, including confidence logic.

FIG. 4B illustrates of embodiment 401 of the method 400 with confidence logic 470 after each step. Confidence logic 470 may be configured to determine the reliability of each step 410-460 or some combination of steps up to and including that step directly before each confidence logic. In one embodiment confidence logic 470 may be configured to repeat the immediately preceding step. In another embodiment, confidence logic 470 may be configured to repeat all or some subset of all steps preceding it. For example, confidence logic 470(4) may be configured to repeat method 401 starting with step 420. This repetition may be determined by the level of confidence measured in confidence logic 470(4). If the measured confidence of confidence logic 470(4) is low enough, it may be determined that the entire method 401 must be repeated. In one embodiment, confidence logic may be implemented in processing logic 102 from FIG. 1 and executed after each step. In another embodiment, confidence logic may be implemented in processing logic 102 and be executed after a subset of steps, including after all steps are completed. In another embodiment, processing logic may be executed by the host after information about the capacitance sensors, contacts, and characteristics are passed to the host.

While six steps and six confidence logic steps are shown in FIG. 4B, one or ordinary skill in the art would understand that more or fewer steps may be necessary for the operation of the device, depending on the application requirements. For example, gesture detection is not illustrated in FIG. 4B, however several additional confidence measurement steps may be devoted to the detection of at least one gesture. In one embodiment, gesture detection may occur by execution of logic within processing logic 102. In another embodiment, gesture detection may occur by processing executed in the host. Furthermore, although a single confidence is shown for each step in FIG. 4B, several confidence measurements may be calculated for each step depending on the complexity of the computation therein. For example a filtering step may include several different layers of filters, each with their own confidence level. The overall confidence of a steps 420 and 440 of FIG. 4B may therefore be a combination of all of the confidences for all of the filters. In another embodiment, there may be several characteristics for each contact on the array and confidences for each characteristic calculated and sent to the host individually or in aggregate.

Figure 4C:
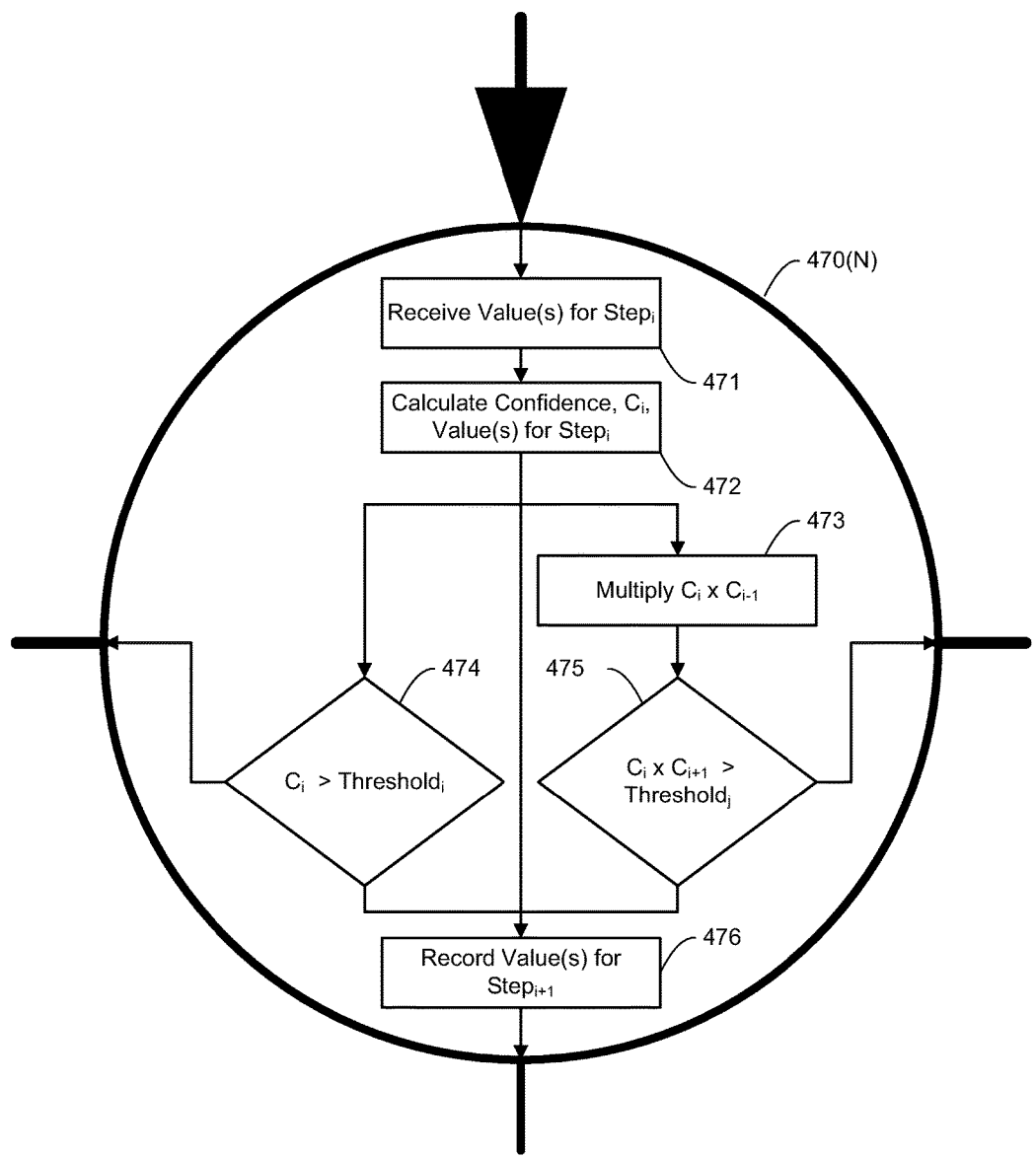
FIG. 4C illustrates one embodiment of confidence logic.

FIG. 4C illustrates one embodiment of a method implemented by confidence logic 470. The value from the preceding step from FIG. 4C is received in step 471. A confidence value, $C_i$, for the received value may be calculated in step 472. The confidence value may be derived from the noise in the system, the power supply level, the processing time allocated to each step 410-460 of FIG. 4B, the processor speed, reference voltages or other measurable parameters in the system. In one embodiment, the confidence level for the immediately preceding step may be compared to a threshold, Threshold$_i$, in decision step 474. If the confidence level is above Threshold$_i$, the received value of step 471 may be recorded in step 476. If the confidence value $C_i$ is not greater than Threshold$_i$, the confidence logic 470 may cause the preceding step(s), one or all, to be repeated. In another embodiment, the calculated confidence level $C_i$ may be multiplied by the confidence level $C_{i+1}$ of the preceding confidence logic in step 473. The product of $C_i$ and $C_{i+1}$ may be compared to another threshold, Threshold$_j$, in step 465. If the product of $C_i$ and $C_{i+1}$ is greater than Threshold$_j$, the received value of step 471 may be recorded in step 476. If the product of $C_i$ and $C_{i+1}$ is not greater than Threshold$_j$, the confidence logic 470 may cause the preceding step(s), one or all, to be repeated. In still another embodiment, the confidence level calculated by confidence logic 470 and the values from each step 410-460 may be recorded and reported to the host for later processing.

FIGS. 5A-D illustrate one embodiment for the calculation of a confidence level of measured capacitance of step 410 in FIG. 4. For the embodiment of FIGS. 5A-D the confidence level is derived from the signal-to-noise ratio (SNR) for each intersection of transmit electrode 122 and received electrode 123 of array 121 of FIG. 1. In the embodiment of Figures A-D, the highest confidence, 100%, may occur at an SNR of 25:1. Thus, the confidence level may be calculated by dividing the actual SNR for each intersection by 25, resulting in a scalar for each intersection. The confidence level, $C_i$, for confidence logic 470(1) of FIG. 4 is given by:

$$\text{Confidence410} = \begin{cases} \dfrac{SNR}{25}, & \text{if } \dfrac{SNR}{25} < 1 \\ 1, & \text{if } \dfrac{SNR}{25} \geq 1 \end{cases} \quad (1)$$

FIG. 5A illustrates an 8×10 array of sensors 500, each corresponding to intersection of in array. FIG. 5B illustrates the detected noise for each of the intersections. FIG. 5C illustrates the SNR for each intersection and FIG. 5D illustrates the calculated confidence of each intersection. Values illustrated in FIGS. 5A-D are shown in Table 1.

TABLE 1

| | Intersection | | | | |
|---|---|---|---|---|---|
| | D3 | C4 | D4 | E4 | D5 |
| Measured Capacitance | 7 | 10 | 100 | 20 | 18 |
| Noise | 1 | 1 | 2 | 1 | 1 |
| SNR | 7 | 10 | 50 | 20 | 18 |
| Confidence | .28 | .40 | 1.0 | 0.80 | .60 |

FIG. 6A illustrates an 8×10 array of sensors 600, each corresponding to intersection of in array. FIG. 6B illustrates the detected noise for each of the intersections. FIG. 6C illustrates the SNR for each intersection and FIG. 6D illustrates the calculated confidence of each intersection. Values illustrated in FIGS. 6A-D are shown in Table 2.

TABLE 2

| | Intersection | | | | |
|---|---|---|---|---|---|
| | D3 | C4 | D4 | E4 | D5 |
| Measured Capacitance | 7 | 10 | 100 | 20 | 18 |
| Noise | 4 | 8 | 10 | 8 | 4 |
| SNR | 1.8 | 1.3 | 10 | 2.5 | 3.5 |
| Confidence | 0.07 | 0.05 | 0.40 | 0.10 | 0.14 |

The change in the detected noise has a profound impact on the confidence of the measured capacitance values from step

410 of FIG. 4B. A difference of noise of 1 to 4 for D3 yields a reduction in confidence from 28% to 7%, which may be enough to require a re-measurement as illustrated in FIG. 4C.

FIGS. 5A-5D and 6A-6D illustrate example values that may be derived from any embodiment for determining a confidence level based on characterics of a touch sensor array, such as any of the embodiments described above.

Figure 7A:
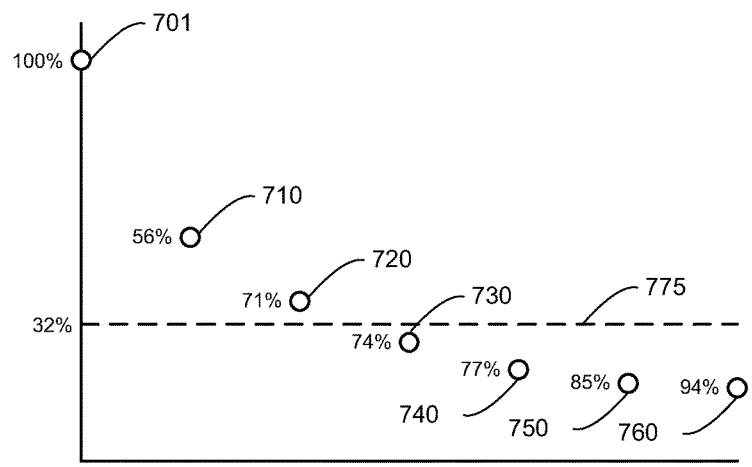
FIGS. 7A-C illustrate examples of confidence levels for various steps in a capacitance sensing system and associated confidence levels.
Figure 7B:
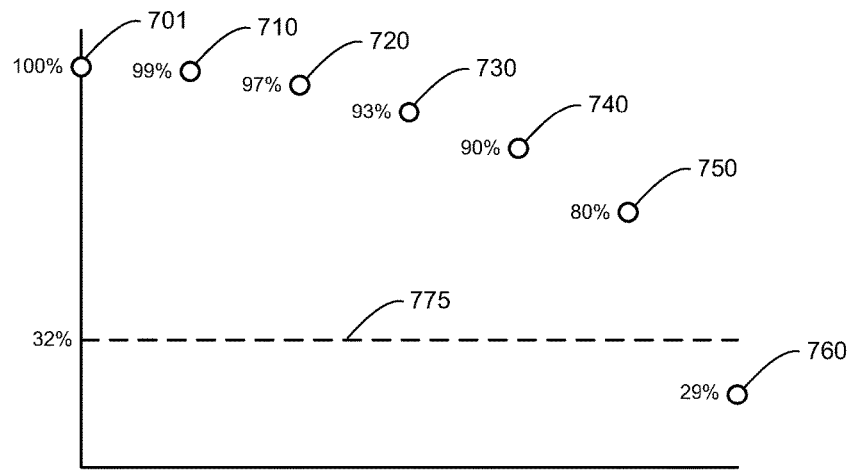
Figure 7C:
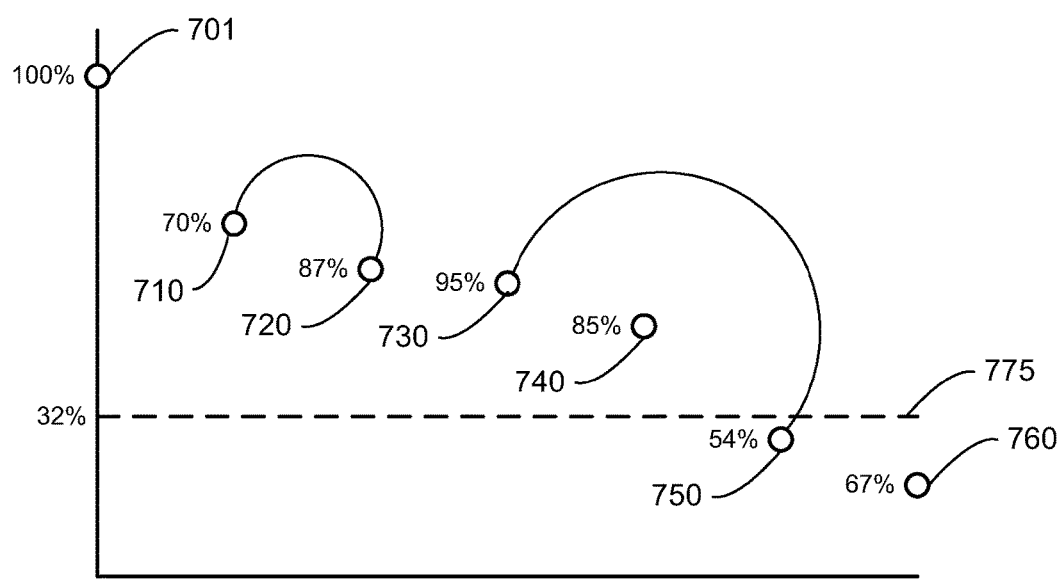

FIGS. 7A-C illustrates several embodiments of various confidence levels for each step 410 through 460. FIG. 7A illustrates an embodiment wherein the capacitance measurement step, 410, has a confidence of 56% and each of the successive steps has steadily increasing confidence. However, because the confidence of each step is impacted by the confidence levels of the steps before it, the overall confidence in the output decreases. By step 430, the overall confidence has decreased to 30%, which is below the threshold of 32%, which may be set as the threshold below which some or all of the preceding steps must be repeated.

FIG. 7B illustrates another embodiment wherein the capacitance measurement step, 410, has a confidence of 99% and each of the successive steps has steadily decreasing confidence. Steps 410 through 450 result in an overall confidence of 80%. However, by step 460, the overall confidence has decreased to 18% because of its 29% confidence for that particular step. This is below the threshold of 32%, which may be set as the threshold below which some or all of the preceding steps must be repeated.

FIG. 7C illustrates another embodiment wherein the capacitance measurement step, 410, has a confidence of 70% and each of the successive steps has higher or lower confidence. In the embodiment of FIG. 7C, the overall threshold is not failed until step 450, which may cause the method of 401 FIG. 4B to repeat all the step or merely go back to step 430 and recalculate the characteristic of the contact(s). In another embodiment, the 87% confidence of step 720 may be less then Threshold$_t$ for that confidence logic (between steps 710 and 720) and step 1 may be repeated.

Values for each confidence level of each step are given in Table 3. The overall confidence level at each step is shown in Table 4.

TABLE 3

| | \multicolumn{6}{c}{Step} | | | | | |
|---|---|---|---|---|---|---|
| | 410 | 420 | 430 | 440 | 450 | 460 |
| FIG. 7A | 56% | 71% | 74% | 77% | 85% | 94% |
| FIG. 7B | 99% | 97% | 93% | 90% | 80% | 29% |
| FIG. 7C | 70% | 87% | 95% | 85% | 54% | 67% |

TABLE 4

| | Step | | | | | |
|---|---|---|---|---|---|---|
| | 410 | 420 | 430 | 440 | 450 | 460 |
| FIG. 7A | 56% | 40% | 30% | 23% | 19% | 18% |
| FIG. 7B | 99% | 95% | 87% | 80% | 64% | 18% |
| FIG. 7C | 70% | 61% | 59% | 50% | 27% | 18% |

For step 420 and confidence logic 470(2) of FIG. 4B, the filtering may be broken up into a number of stages, such as an IIR filter, a common-mode filter, and others. As an illustration of confidence calculation for the filtering step 420, a simple IIR filter is shown. The IIR filter of step 420 is given by:

$$NewValue = \frac{(256 - FilterValue) \cdot NewValue}{256} + \frac{FilterValue \cdot NewValue}{256} \quad (2)$$

Higher filter values may yield lower confidence in the final value matching, but may yield higher confidence since the overall SNR is improved since noise has been reduced. The trade off is that higher SNR is achieved, but at a slower response time of the measurement system. In a system where more filtering adds more error, zero filtering would yield a confidence of 100% for that step. Thus, the confidence for step 420 and confidence logic 470(2) is given by:

$$Confidence = \frac{1}{2} \cdot \frac{256 - FilterValue}{256} + \frac{1}{2} \quad (3)$$

For step 430 and confidence logic 470(3) of FIG. 4B, the contact characteristic of position may be calculated using a centroid of a 3×3 matrix of sensors, a 5×5 matrix of sensors, the entire array, or some other combination. Second order processing may correct for edge effects, large or small fingers, jitter, the effects of two contacts in close proximity or any number of other phenomena. Each phenomenon has a different impact on the confidence of the position calculation for each contact. Also, since the position is a calculated downstream of the analog-to-digital conversion and a product of several intersections, the confidence of that position may be calculated as some combination of the confidence of the digital values for each of the filtered capacitance values. This combination may be the mean confidence of all sensors, the minimum confidence of all sensors, or a weighted average of the confidences for all sensors. In one embodiment, the weighted average may weight the center greater than the surrounding sensors. In another embodiment, the weighted average may weigh sensors with the highest capacitance, regardless of their confidence level. An examine of confidence based on the minimum of all sensors is given by:

$$Confidence_{430} = min(Confidence_{i,j}) \quad (4)$$

Continuing on the example data from FIGS. 5A-D and 6A-D, the confidence data for the low-noise touch is 28%, while the confidence of the high-noise touch is 5%. There is very little confidence in the touch value for the high-noise touch at confidence logic 470(3). Therefore one or more of the preceding steps may be repeated. For the low-noise touch, the confidence is much higher than for the high-noise touch, but still only 28%. This may be improved by repeating the preceding steps, or lowering the SNR requirement of step 410 and confidence logic 470(1). For example if the SNR requirement was lowered to 10, the minimum confidence for step 410 and confidence logic 470(1) would be 80%, giving step 430 and confidence logic 470(3) a confidence value of 80% if the minimum was used.

For step 440 and confidence level 470(4) of FIG. 4B, the characteristic filter for the position may be another IIR filter, a distance-based filter, or another filter designed to eliminate minor variations or errors in the position characteristic calculation. The greater the filtering, the greater the confidence in the value calculated. However greater filtering results in more lag in the reporting since more information may be gathered for each touch or more processing may be necessary to execute the filter. For a distance-based filter, where the finger must move a certain distance before the new value is reported, the error may be as large as the area around the first contacted position characteristic. If an IIR filter is used, the confidence equation would be similar to that given in Equation 3.

For step 450 and confidence level 470(5), of FIG. 4B, an identification is assigned to each contact on array 121. Typical algorithms that assign a contact ID are based on the distance traveled from the previous measurement cycle to the current measurement cycle. If the distance is too great, the confidence may be lower. Contact identification algorithms may include a least squares calculation, a nearest neighbor calculation, a combination of both, or some other method. The confidence from 470(5) may be given by $$\text{Confidence}_{450} = \frac{1}{2^d} \quad (5)$$

Step 460 and confidence logic 470(6) or FIG. 4B may be representative of the fully-processed contact position characteristics that are reported to the host. Each contact may have a confidence value associated with it, and the host may have different thresholds depending on the context. In one embodiment, the confidence level for buttons displayed on an LCD may be difference for normal finger movement, such as would be employed in a drawing application. The confidence of confidence logic 470(6) may be a combination of all values from 470(1)-(5). In one embodiment, certain steps may be weighted higher than others. For example the capacitance measurement and position characteristic calculation steps may be determined most critical to the overall system and may be weighted accordingly.

Figure 8A:
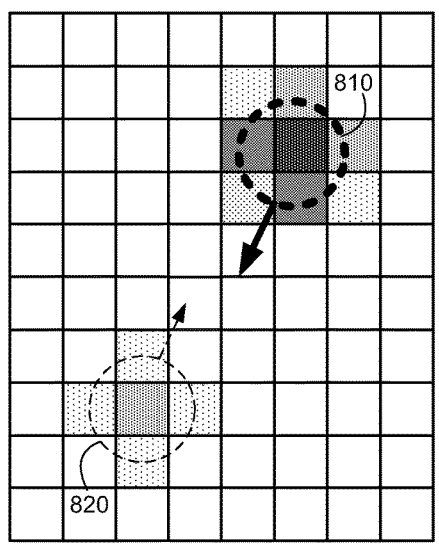
FIGS. 8A-B illustrates an example of confidence for gesture detection.

FIG. 8A illustrates an example of two contacts on an array, each with different confidence values. Contact 810 has a much higher confidence value than contact 820, as illustrated by the strength of the capacitance measurement values (darker is representative of greater capacitance change). If these two contacts are moving toward each other, a pinch gesture may be detected. If the confidence level of contact 820 is low enough (less than the 32% of FIGS. 7A-C), the contact location and the associated gesture may be falsely detected.

Figure 8B:
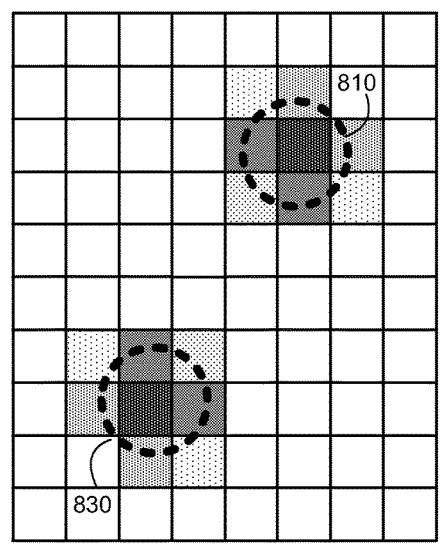

This is in contrast to FIG. 8B, where both contacts have strong signal strengths and their associated confidence values are correspondingly high.

Figure 9A:
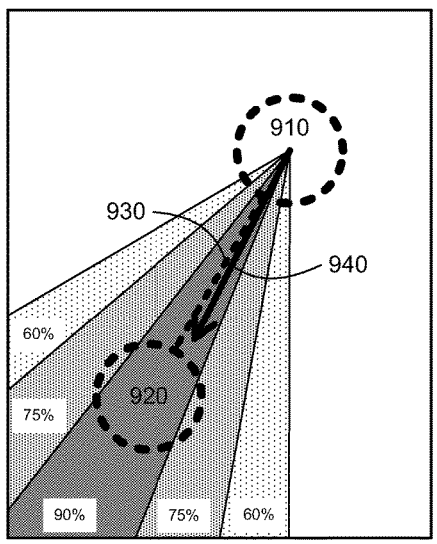
FIG. 9A-B illustrates an embodiment of calculation of confidence level for gesture detection.

FIG. 9A illustrates one embodiment for the calculation of confidence of a detected "pinch" gesture. In FIG. 9A, contact 910 moves toward contact 920. A line 930 may be drawn between the two contacts and the angle between the line between the two contacts and the path 940 of contact 910 may be calculated. A smaller angle may result in a higher confidence value since it is more likely that contacts 910 and 920 are moving toward each other. In the example in FIG. 9A, the angle of the line 930 and the path 940 is quite small, resulting in a high confidence (90%) that a "pinch" gesture has occurred.

Figure 9B:
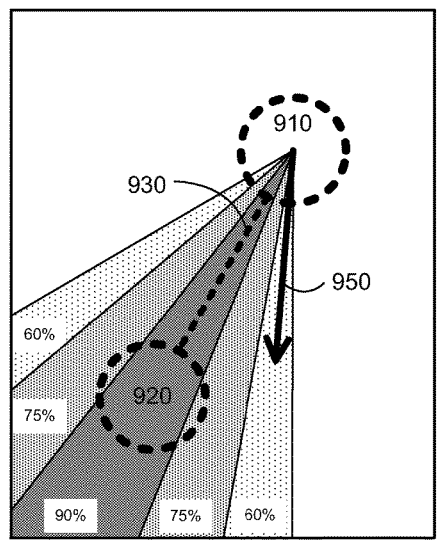

FIG. 9B illustrates one embodiment for the calculation of confidence of a detected "pinch" gesture. The angle of the line 930 and the path 450 is much larger, yielding a lower confidence (60%). In this example contacts 910 and 920 may be reporting a "rotate" gesture, so a subsequent or parallel determination of confidence for a rotate gesture may be necessary. Although only one gesture is illustrated and another listed, it would be clear to one or ordinary skill in the art that the detection of multiple gestures and associated confidence levels is possible. An input system may have dozens of gestures, including tap, double-tap, motion, scroll, zoom in, zoom out, rotate, pan, next item, and many more. Confidence levels for gestures and touches may be particularly useful for destructive gestures. If a gesture is detected that deletes a file in an operating system, navigates away from a critical window in an internet browser, or performs a function in a program that is very sensitive to motion, the detected gesture may substantially impair the user experience if incorrect. If the processing device is able to determine the legitimacy of the detected gesture in a holistic processing, more reliable operation and greater fidelity to user intention may be achieved. The confidence of the detected gesture may be calculated by processing logic 102 or by the host as described in FIG. 4C.

Figure 10:
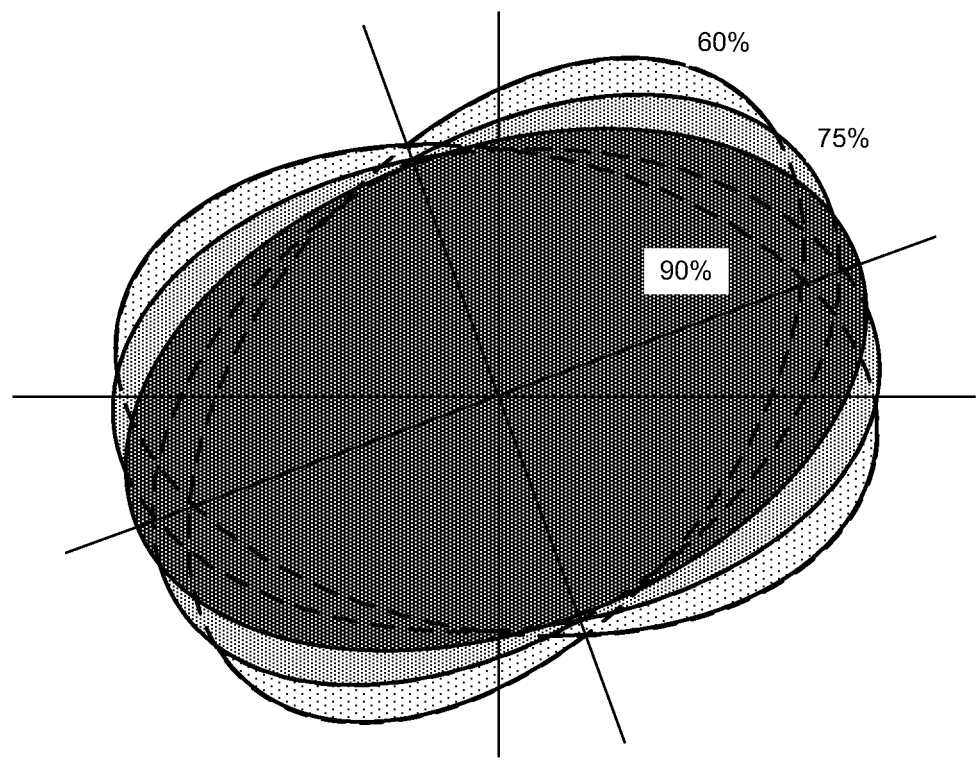
FIG. 10 illustrates an embodiment confidence levels for contact shape and angle calculation.

FIG. 10 illustrates still another confidence value that may be used to determine the reliability of the information sent to the host. Contacts on an array may have an elliptical shape rather than one that is perfectly circular. In these cases, the long and short axes as well as the angle of each of the long and short axes may be reported to the host. In the embodiment shown in FIG. 10, an elliptical contact may have ranges of confidence of 90%, 75%, and 60% based on such factors as the contact location and jitter or noise in the contact location. The confidence level of the angle for the elliptical contact may be passed to the host for further processing in the operating system of the device. The shape and angle of a contact on the array 121 may be determined in step 430 from FIGS. 4A and 4B. The confidence of the shape and angle may be calculated in step 470(3), which may be completed by processing logic 102 or by the host.

While capacitance sensing, both mutual and self, are described herein, one of ordinary skill in the art may apply the calculation of confidence levels to various steps of any sensing technology, including resistive, optical, pressure, infra-red and others. For resistive sensors, the analog-to-digital conversion for each axis may have a confidence level. For optical and infra-red sensing, with the use of cameras, the pixilated image may have a confidence level for each pixel. For pressure sensors, the force-sensing resistor or other hardware may have an output that is sensitive to some noise stimulus, creating a confidence therein. For each of the above methods, confidence levels of the processing after the initial measurement may also improve the functionality of the device. For these steps, similar processing as described in FIGS. 4A-C may be implemented.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. A method implemented by a demodulation circuit, an analog-to-digital converter (ADC), a touch coordinate converter, and confidence logic, comprising:
   identifying at least one contact on a capacitive sensor array including a plurality of capacitance sensing electrodes;
   measuring, by the demodulation circuit and the ADC, capacitance of at least one capacitance sensing electrode of the capacitive sensor array associated with the at least one contact;
   determining, by the touch coordinate converter, a characteristic for the at least one contact on the capacitive sensor array based on the measured capacitance of the at least one capacitance sensing electrode;
   determining, by the confidence logic, a plurality of individual confidence levels for the measured capacitance, the characteristic, and the at least one contact;
   generating, by the confidence logic, an overall confidence level for the characteristic of the at least one contact on the capacitive sensor array by multiplying the plurality of individual confidence levels;
   in accordance with a determination that the overall confidence level of the characteristic is lower than a threshold level:
      re-measuring, by the demodulation circuit and the ADC, the capacitance of the at least one capacitance sensing electrode;
      re-determining, by the touch coordinate converter, the characteristic; re-determining, by the confidence logic, the plurality of individual confidence levels for the measured capacitance, the characteristic, and the at least one contact; and
      re-generating, by the confidence logic, the overall confidence level until the overall confidence level is above the threshold level, thereby improving confidence of the capacitance measured by the demodulation circuit and ADC; and
   in accordance with a determination that the overall confidence level is above the threshold level, reporting the at least one contact to a host that is configured to provide further processing of the at least one contact.

2. The method of claim 1, wherein the characteristic for the at least one contact on the capacitive sensor array is a position of the at least one contact on the capacitive sensor array.

3. The method of claim 1, wherein the characteristic for the at least one contact on the capacitive sensor array is a size of the at least one contact on the capacitive sensor array.

4. The method of claim 1, wherein the characteristic for the at least one contact on the capacitive sensor array is a shape of the at least one contact on the capacitive sensor array.

5. The method of claim 1, wherein the at least one contact on the capacitive sensor array has an elliptical shape including a long axis and a short axis, and the characteristic, for the at least one contact on the capacitive sensor array, is an angle of the long or short axis of the elliptical shape corresponding to the at least one contact on with respect to a vertical or horizontal axis of the capacitive sensor array.

6. The method of claim 1, wherein the at least one contact has an elliptical shape, the method further comprising:
   identifying a long axis and a short axis of the at least one contact on the capacitive sensor array;
   identifying a vertical or horizontal axis on the capacitive sensor array;
   determining an angle of either the long axis or the short axis with respect to the identified vertical or horizontal axis on the capacitive sensor array; and
   determining a confidence level of the angle.

7. The method of claim 1, further comprising:
   detecting a gesture performed by the at least one contact; and
   calculating a confidence level for the gesture performed by the at least one contact.

8. The method of claim 1, wherein the measuring capacitance comprises calculating a confidence level for the measured capacitance of each sensing electrode, and the confidence level is a factor of at least one external stimulus.

9. The method of claim 8, wherein the confidence level for the measured capacitance is a factor of a respective signal to noise ratio calculated for the measured capacitance of each sensing electrode.

10. The method of claim 1, wherein the confidence level for the characteristic and the measured value for each step are sent to the host.

11. The method of claim 1, further comprising:
   when the confidence level for the characteristic is greater than the threshold level, passing the measured capacitance of the at least one capacitance sensing electrode, a contact identification of the at least one contact, and a contact position of the at least one contact to the host; and
   when the confidence level is less than the threshold level, repeating at least one of the operations of measuring capacitance of at least one capacitance sensing electrode, identifying at least one contact, and determining a characteristic for the at least one contact.

12. The method of claim 1, wherein each of the steps of measuring the capacitance, identifying the at least one contact, and determining the characteristic is associated with at least one confidence level.

13. An apparatus comprising:
   a capacitive sensor array including a plurality of capacitance sensing electrodes; and
   a demodulation circuit, an ADC, a touch coordinate converter, and confidence logic, wherein the demodulation circuit is coupled to the plurality of capacitance sensing electrodes;
   wherein the apparatus is configured to:
      measure, by the demodulation circuit and the ADC, capacitance for at least one capacitance sensing electrode of the capacitive sensor array;

identify at least one contact on the at least one capacitance sensing electrode; determine, by the touch coordinate converter, a characteristic for the at least one contact on the at least one capacitance sensing electrode based on the measured capacitance of the at least one capacitance sensing electrode;

determine, by the confidence logic, a plurality of individual confidence levels for the measured capacitance, the characteristic, and the at least one contact;

generate, by the confidence logic, an overall confidence level for the characteristic of the at least one contact on the at least one capacitance sensing electrode by multiplying the plurality of individual confidence levels;

determine whether the overall confidence level of the characteristic is higher than a threshold levels;

in accordance with a determination that the overall confidence level is above the threshold level, report the at least one contact having the corresponding overall confidence level to a host that is configured to provide further processing of the at least one contact, wherein the overall confidence level being above the threshold level improves confidence of the capacitance measured by the demodulation circuit and ADC and confidence of contact information reported to the host.

14. The apparatus of claim 13, wherein the at least one contact has an elliptical shape and the apparatus is further configured for:

identifying a long axis and a short axis of the at least one contact on the capacitive sensor array;

identifying a vertical or horizontal axis on the capacitive sensor array;

determining an angle of either the long axis or the short axis with respect to the identified vertical or horizontal axis on the capacitive sensor array; and determining a confidence level of the angle.

15. The apparatus of claim 13, wherein the apparatus is further configured to:

detect a gesture performed by the at least one contact; and calculate a confidence level for the gesture performed by the at least one contact.

16. The apparatus of claim 13, wherein the apparatus is further configured to:

when the confidence level for the characteristic is greater than the threshold level, pass the measured capacitance of the at least one capacitance sensing electrode, a contact identification of the at least one contact, and a contact position of the at least one contact to the host; and when the confidence level is less than the threshold level, repeat at least one of the operations of measuring capacitance of at least one capacitance sensing electrode, identifying at least one contact, and determining a characteristic for the at least one contact.

17. The apparatus of claim 13, wherein the apparatus is further configured to:

filter the measured capacitance and the calculated characteristic for the at least one contact using one or more filters; and calculate a confidence level for the filtered measured capacitance and calculated characteristic.

18. The apparatus of claim 17, wherein the one or more filters include a digital infinite impulse response filter.

19. The apparatus of claim 17, wherein the confidence level of the calculated characteristic is derived, at least in part, from the confidence level of the filtered measured capacitance confidence level.

20. A system comprising:

a capacitive sensor array including a plurality of capacitance sensing electrodes; a demodulation circuit, an ADC, a touch coordinate converter, and confidence logic, which are coupled to the plurality of capacitance sensing electrodes; wherein the system is configured to:

measure, by the demodulation circuit and the ADC, capacitance for at least one capacitance sensing electrode of the capacitive sensor array;

identify at least one contact on the at least one capacitance sensing electrode;

determine, by the touch coordinate converter, a characteristic for the at least one contact on the at least one capacitance sensing electrode based on the measured capacitance of the at least one capacitance sensing electrode;

determine, by the confidence logic, a plurality of individual confidence levels for the measured capacitance, the characteristic, and the at least one contact;

generate, by the confidence logic, an overall confidence level for the characteristic of the at least one contact on the at least one capacitance sensing electrode at least by multiplying the plurality of individual confidence levels;

in accordance with a determination that the overall confidence level of the characteristic is lower than a threshold level;

re-measure, by the demodulation circuit and the ADC, the capacitance of the at least one capacitance sensing electrode;

re-determine, by the touch coordinate converter, the characteristic;

re-determine, by the confidence logic, the plurality of individual confidence levels for the measured capacitance, the characteristic, and the at least one contact; and re-generate, by the confidence logic, the overall confidence level until the overall confidence level is above the threshold level, thereby improving confidence of the capacitance measured by the demodulation circuit and ADC; and in accordance with a determination that the overall confidence level of the characteristic is higher than the threshold level, report the at least one contact to a host that is configured to provide further processing of the at least one contact;

wherein the host is configured to receive data that includes at least one of the measured capacitance, an identified position of the at least one contact, and a contact identification of the at least one contact, and wherein the host performs one or more actions in response to receiving the data.

21. The system of claim 20 wherein the host is configured to calculate a confidence level for the characteristic of the at least one contact on the at least one capacitance sensing electrode.

22. The system of claim 20, wherein the system is further configured to repeat at least one of the steps of measuring capacitance, identifying at least one contact, and determining a characteristic for the at least one contact.

23. The system of claim 20, wherein the system is further configured to:
   detect a gesture performed by the at least one contact;
   calculate a confidence level for the gesture performed by the at least one contact; and
   output the detected gesture and confidence level for the detected gesture to the host.

24. The system of claim 20, wherein confidence levels for each step are output to the host.

* * * * *

UNITED STATES PATENT AND TRADEMARK OFFICE
CERTIFICATE OF CORRECTION

PATENT NO. : 10,352,975 B1
APPLICATION NO. : 13/727944
DATED : July 16, 2019
INVENTOR(S) : Peterson et al.

Page 1 of 1

It is certified that error appears in the above-identified patent and that said Letters Patent is hereby corrected as shown below:

In the Claims

Claim 13, Column 15, Line 16, please delete "a threshold levels;" and insert --a threshold level;--.

Signed and Sealed this
First Day of October, 2019

Andrei Iancu
*Director of the United States Patent and Trademark Office*